US010083848B2

(12) United States Patent
Tominaga

(10) Patent No.: US 10,083,848 B2
(45) Date of Patent: Sep. 25, 2018

(54) ARTICLE STORAGE RACK AND ARTICLE STORAGE FACILITY INCLUDING SAME

(71) Applicant: Daifuku Co., Ltd., Osaka-shi (JP)

(72) Inventor: Hirofumi Tominaga, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 147 days.

(21) Appl. No.: 15/399,175

(22) Filed: Jan. 5, 2017

(65) Prior Publication Data
US 2017/0194184 A1 Jul. 6, 2017

(30) Foreign Application Priority Data
Jan. 6, 2016 (JP) .................................. 2016-001094

(51) Int. Cl.
*B01L 1/04* (2006.01)
*H01L 21/677* (2006.01)
(Continued)

(52) U.S. Cl.
CPC ........ *H01L 21/67769* (2013.01); *A47B 81/00* (2013.01); *F24F 7/08* (2013.01); *H01L 21/67775* (2013.01)

(58) Field of Classification Search
CPC ......... H01L 21/67769; H01L 21/67775; A47B 81/00; F24F 7/08
(Continued)

(56) References Cited

U.S. PATENT DOCUMENTS

| 5,944,602 A * | 8/1999 | Grundy | F24F 3/161 |
| | | | 16/266 |
| 2015/0000785 A1* | 1/2015 | Shin | F17C 5/007 |
| | | | 141/4 |

(Continued)

FOREIGN PATENT DOCUMENTS

JP 2002252277 A 9/2002

*Primary Examiner* — Vivek Shirsat
(74) *Attorney, Agent, or Firm* — The Webb Law Firm

(57) ABSTRACT

An article storage rack is provided in which it is easy to form a downflow around an article being stored and which has shelf members each of which can properly support the weight of an article. An article storage facility that includes such an article storage rack is also provided. Each shelf member has a support plate portion which is generally plate-shaped and which extends along a horizontal plane, and support frame members which are located below the support plate portion to support the support plate portion from below, and is formed in a shape that tapers toward a distal end portion thereof such that the width of the support plate portion, along a rack lateral direction, is narrower toward the distal end portion. wherein each support frame member includes an elongate member located and arranged to extend along the support plate portion. And a pair of support frame members are provided to each shelf member such that one support frame member is located on each side of the support plate portion with respect to the cut-out portion, along the rack lateral direction. A proximal end side portion has a portion that overlaps with an article storing area formed under it as seen along the rack lateral direction. And both proximal end side portions of the pair of support frame members are located outside the article storing area along the rack lateral direction as seen along the vertical direction.

7 Claims, 10 Drawing Sheets

(51) Int. Cl.
*A47B 81/00* (2006.01)
*F24F 7/08* (2006.01)

(58) Field of Classification Search
USPC .............. 454/173, 183, 184, 187; 211/126.1, 211/126.5, 41.17, 41.18
See application file for complete search history.

(56) References Cited

U.S. PATENT DOCUMENTS

| | | | |
|---|---|---|---|
| 2015/0003942 A1* | 1/2015 | Takahara | A47B 81/00 414/277 |
| 2015/0202664 A1* | 7/2015 | Murata | H01L 21/67769 134/25.5 |
| 2016/0276852 A1* | 9/2016 | Roberts | H02J 7/0027 |
| 2016/0289001 A1* | 10/2016 | Shibata | H01L 21/67769 |

* cited by examiner

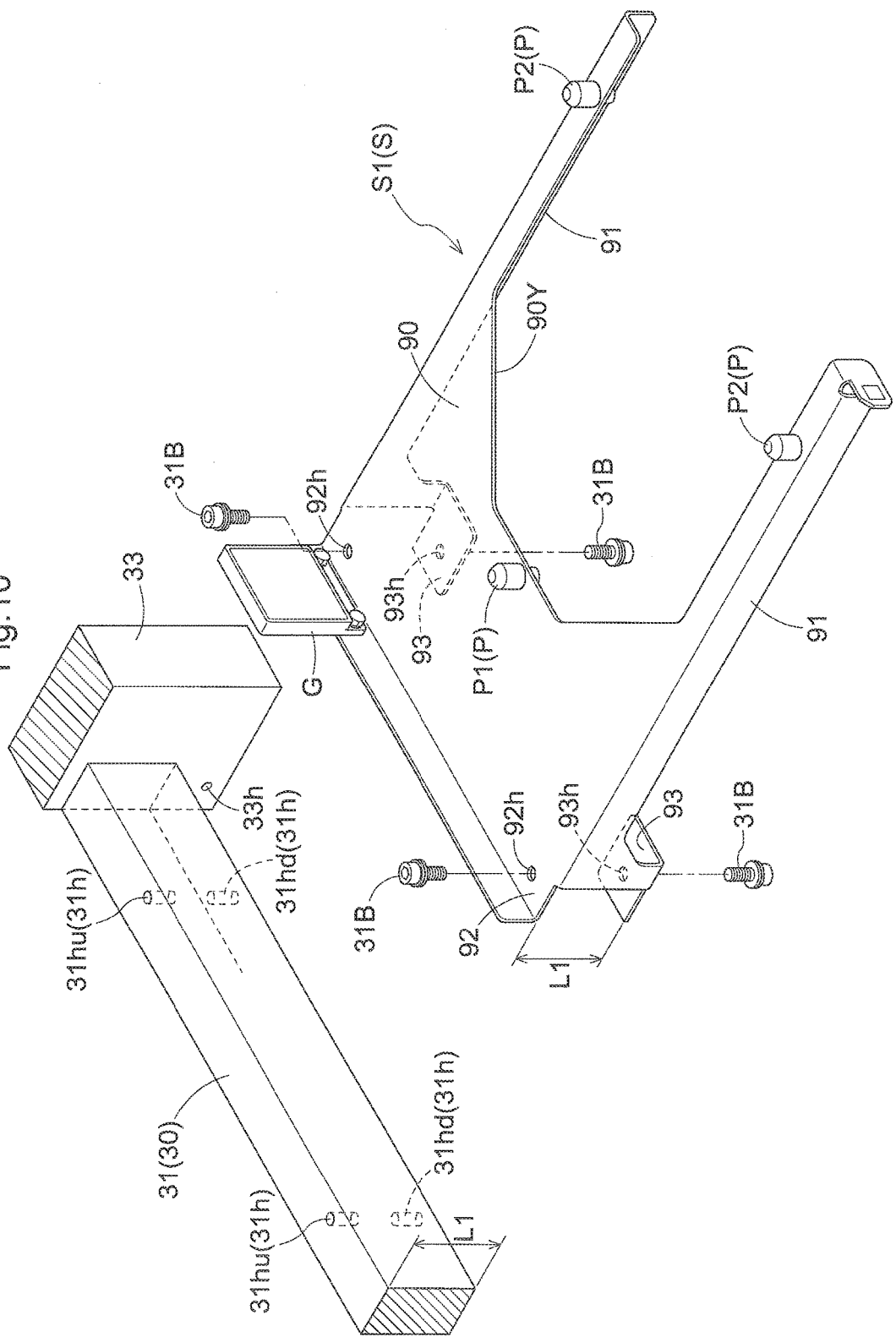

US 10,083,848 B2

ARTICLE STORAGE RACK AND ARTICLE STORAGE FACILITY INCLUDING SAME

CROSS-REFERENCE TO RELATED APPLICATION

This application claims priority to Japanese Patent Application No. 2016-001094 filed Jan. 6, 2016, the disclosure of which is hereby incorporated in its entirety by reference.

FIELD OF THE INVENTION

The present invention relates to an article storage rack for storing articles.

BACKGROUND

An example of such an article storage racks is disclosed in JP Publication of Application No. 2002-252277 (Patent Document 1). The article storage rack of Patent Document 1 is installed in a clean room, and is provided to store containers for holding a plurality of semiconductor substrates (see Paragraph [0033] of Patent Document 1). The rack has plate-shaped top boards 5 extending along the horizontal plane as shown in FIG. 1 of Patent Document 1.

Formed in each top board 5 of the article storage rack of Patent Document 1 is a cut-out portion which provides an opening along the vertical direction that opens in the direction (projecting direction) in which the top board 5 projects. The cut-out portion is so dimensioned that a movable support member of a transfer device which supports a container to be stored can pass through the opening along the vertical direction. The article storage rack of Patent Document 1 can transfer a container from the movable support member to the rack by moving the movable support member which is supporting the container from a position above the top board 5 to a position below the top board 5 through the cut-out portion. In addition, the article storage rack of Patent Document 1 can transfer a container from the rack to the movable support member by moving the movable support member which is not supporting any container from a position below the top board 5 to a position above the top board 5 through the cut-out portion. The structural strength of the top board 5 is weakened because such a cut-out portion is formed. In order to reinforce each top board 5, supporting ribs 6 which support the top board 5 from below are provided in the article storage rack of Patent Document 1.

In the article storage rack of Patent Document 1, a plurality of columns 3 which project in the projecting direction with respect to a reference surface, and which are spaced apart from one another along a lateral or right and left direction which is horizontal and is perpendicular to the projecting direction. And article storing areas for storing articles are formed between two columns 3 that are adjacent each other along the lateral direction. The proximal end portion of each supporting rib 6 is attached to a corresponding column 3 at a position that is offset or displaced from the reference surface in the projecting direction. In addition, in order to support the weight of the container properly, the distal end side portion of each supporting rib 6 is located at a position that overlaps with the area in which the article exists as seen along the vertical direction.

SUMMARY OF THE INVENTION

Within a clean room in which the article storage rack is installed as in the case of Patent Document 1, in order to keep minute particles, that are the causes of contamination of the semiconductor substrates held in the containers, from floating around the containers, air current (downflow) that moves downward from elevated positions is generated in the area in which the article storage rack is installed so as to cause the floating particle to be moved downward and to be collected. However, with the structure disclosed in Patent Document 1, each top board 5 supporting a container is formed to have such a shape that it extends to outer locations along the rack lateral direction, i.e., the right and left direction of the rack, as seen along the vertical direction, so that the space laterally outside the container supported by the top board 5 is partitioned off from above and below. This makes it difficult for a downflow to form around the container supported by the top board 5.

Therefore, an article storage rack is desired in which it is easy to form a downflow around articles being stored and which has shelf members each of which can properly support the weight of an article. An article storage facility that includes such an article storage rack is also desired.

The article storage rack comprises: a rack frame having a reference surface which extends along a vertical direction; a plurality of shelf members each of which is attached to the rack frame and is configured to support an article being stored from below; wherein the plurality of shelf members are arranged in a line along the vertical direction, wherein an article storing area in which an article is stored is formed between any two shelf members of the plurality of shelf members that are adjacent each other along the vertical direction, wherein each shelf member of the plurality of shelf members is attached to the rack frame in a cantilever fashion such that each shelf member projects from the reference surface in a projecting direction along a horizontal direction, wherein each of the plurality of shelf members has a support plate portion which is generally plate-shaped and which extends along a horizontal plane, and support frame members which are located below the support plate portion and at positions such that the support frame members overlap with the support plate portion as seen along the vertical direction to support the support plate portion from below, wherein the support plate portion is formed in a shape that tapers toward a distal end portion thereof such that a width of the support plate portion, along a rack lateral direction which is parallel to the horizontal plane and is perpendicular to the projecting direction, is narrower toward the distal end portion, wherein a cut-out portion is formed in the support plate portion, the cut-out portion providing an opening, along the vertical direction, that opens in the projecting direction, wherein each of the support frame members includes an elongate member located and arranged to extend along the support plate portion, wherein a pair of support frame members are provided to each of the plurality of shelf members such that one support frame member is located on each side of the support plate portion with respect to the cut-out portion, along the rack lateral direction, wherein each support frame member in the pair of the support frame members has a proximal end side portion which includes a proximal end portion in contact with the reference surface, and a distal end side portion which is a portion located on the projecting direction side with respect to the proximal end side portion, wherein the proximal end side portion has a portion that overlaps with an article storing area formed under a corresponding support plate portion supported by the support frame member that includes the proximal end side portion, as seen along the rack lateral direction, wherein the distal end side portion is located above the article storing area formed under the corresponding support plate portion supported by the support frame member that includes the proximal end side portion, as seen along the rack lateral direction, and wherein the support frame members in the pair of support frame members are arranged to extend at angles with respect to the projecting direction and in such directions that a distance of separation between the support frame members in the pair along the rack lateral direction is gradually smaller toward distal ends of the support frame members in the projecting direction, such that both of proximal end side portions of the pair of support frame members are located outside the article storing area along the rack lateral direction as seen along the vertical direction and such that each of distal end side portions of the pair of the support frame members has a portion that overlaps with the article storing area as seen along the vertical direction.

That is, because the support plate portion is formed in a shape that tapers toward a distal end portion thereof such that a width of the support plate portion is narrower toward the distal end portion, a space (referred to as the "space outside the shelf member") through which a downflow of gas can move can be formed outward of both side edges (with respect to the rack lateral direction) of the support plate portion. Here, since the support frame members are located at positions at which their proximal end portions overlap with the support plate portion as seen along the vertical direction, with the support frame members in contact with the reference surface of the rack frame, the proximal end side portions of the support frame members can be located close to each other along the rack lateral direction. And the support frame members project in the projecting direction with the support frame members in contact with the reference surface of the rack frame. And the support frame members are arranged to extend at angles with respect to the projecting direction and in such directions that the distance of separation between the support frame members in the pair along the rack lateral direction is gradually smaller toward distal ends of the support frame members in the projecting direction. Thus, the width of the support plate portion can be made small over its entire length along the projecting direction, and the space outside the shelf member can be formed over the entire length along the projecting direction. This arrangement makes it easier to form a downflow outward of both side edges (with respect to the rack lateral direction) of the support plate portion.

Further, since the distal end side portions of the pair of the support frame members are both located such that they overlap with the article storing area as seen along the vertical direction, the load or weight of the article supported by the support plate portion can be properly supported from below the article by the support frame members.

Thus, with the arrangement described above, an article storage rack is provided in which it is easy to form a downflow around articles being stored and which has shelf members each of which can properly support the weight of an article.

BRIEF DESCRIPTION OF THE DRAWINGS

FIG. 10 is an exploded perspective view showing how an existing shelf member is attached.

DETAILED DESCRIPTION

Embodiments of an article storage rack in accordance with the present invention are described with reference to the attached drawings in terms of an example in which the present invention is applied to a semiconductor container stocker which is an example of an article storage facility.

As shown in FIGS. 1-4, the semiconductor container stocker 10 in accordance with the present embodiment is configured to store semiconductor containers B as articles to be stored. Each semiconductor container B may be, for example among other possibilities, a FOUP or a FOSB for holding one or more semiconductor substrates. The semiconductor container stocker 10 has a plurality of article storage racks arranged one next to another along a rack lateral (right and left) direction, with each article storage rack being a storage rack unit U. Further, storage rack units U are installed in pairs such that the storage rack units U in each pair are spaced apart from each other along a rack front and back direction and such that the direction in which the semiconductor containers B are carried into (or carried out of) one of the storage rack units U is opposite from the direction in which the semiconductor containers B are carried into (or carried out of) the other of the storage rack units U. And a travel space through which a stacker crane C moves is provided between the storage rack units U (in each pair of storage rack units U) that are spaced apart from each other along the rack front and back direction. And a travel rail R is installed in the travel space along the rack lateral direction. In addition, the taking-in-and-out stations 10T are provided which are used to take the semiconductor containers B into the interior, and out to the exterior, of the semiconductor container stocker 10.

Each storage rack unit U has a rack frame, and shelf members S each of which is attached to the rack frame to support an article from below. The rack frame has columns 33 which are spaced apart from one another along the rack lateral direction, laterally extending members 30 each of which is connected to, and extend between, adjacent columns 33 such that its longitudinal direction extends horizontally, and shelf members S each of which is attached to a laterally extending member 30 and projects horizontally from the laterally extending member 30. In this case, the direction of projection (or simply projecting direction) is a horizontal direction that is perpendicular to the direction along which the travel rail R extends and that points toward the travel rail R, in plan view. In the present embodiment, a back end portion of the shelf member S, with respect to the projecting direction, is supported by a laterally extending member 30.

Figure 2:
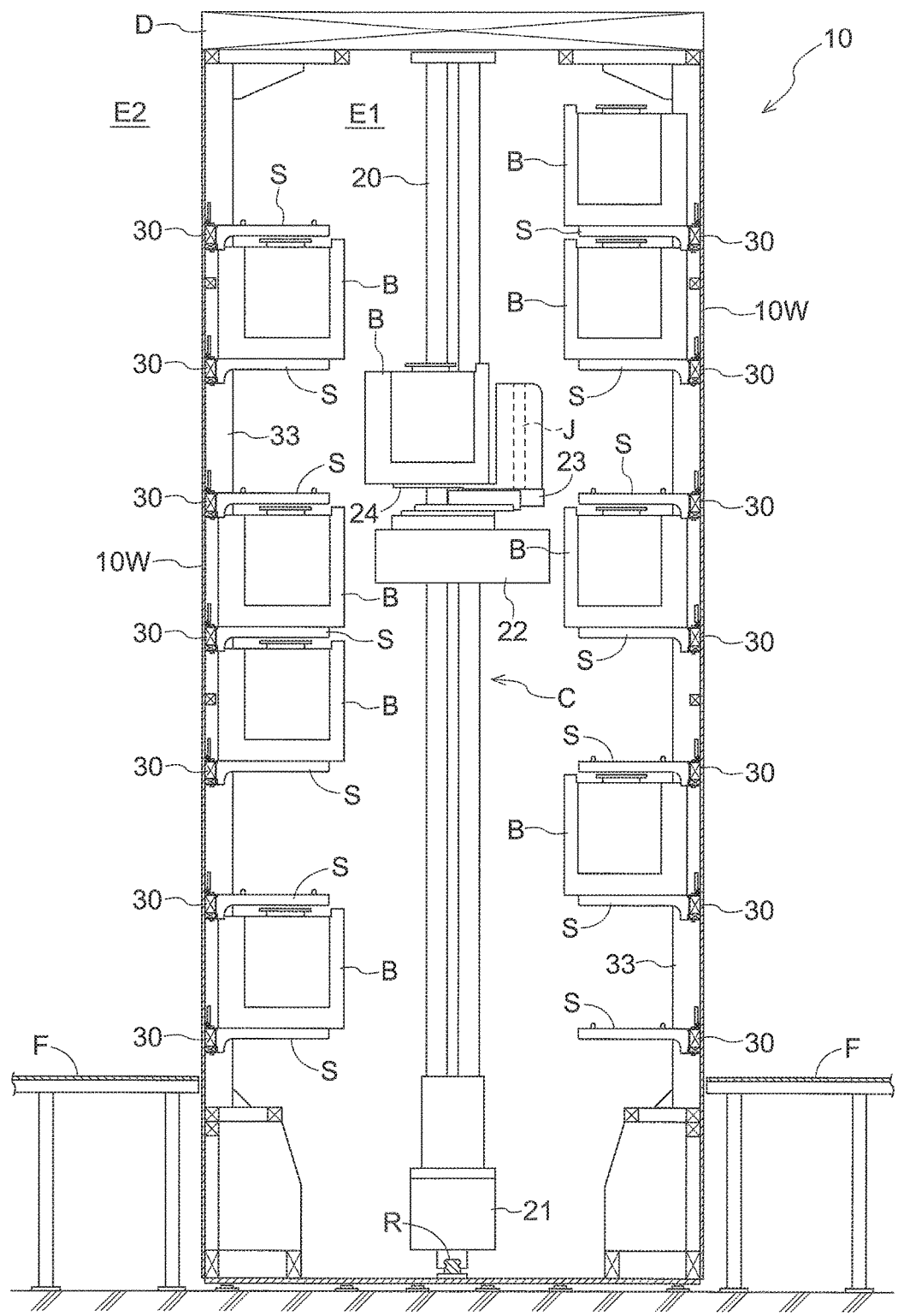
FIG. 2 is a side sectional view of the semiconductor container stocker.
Figure 3:
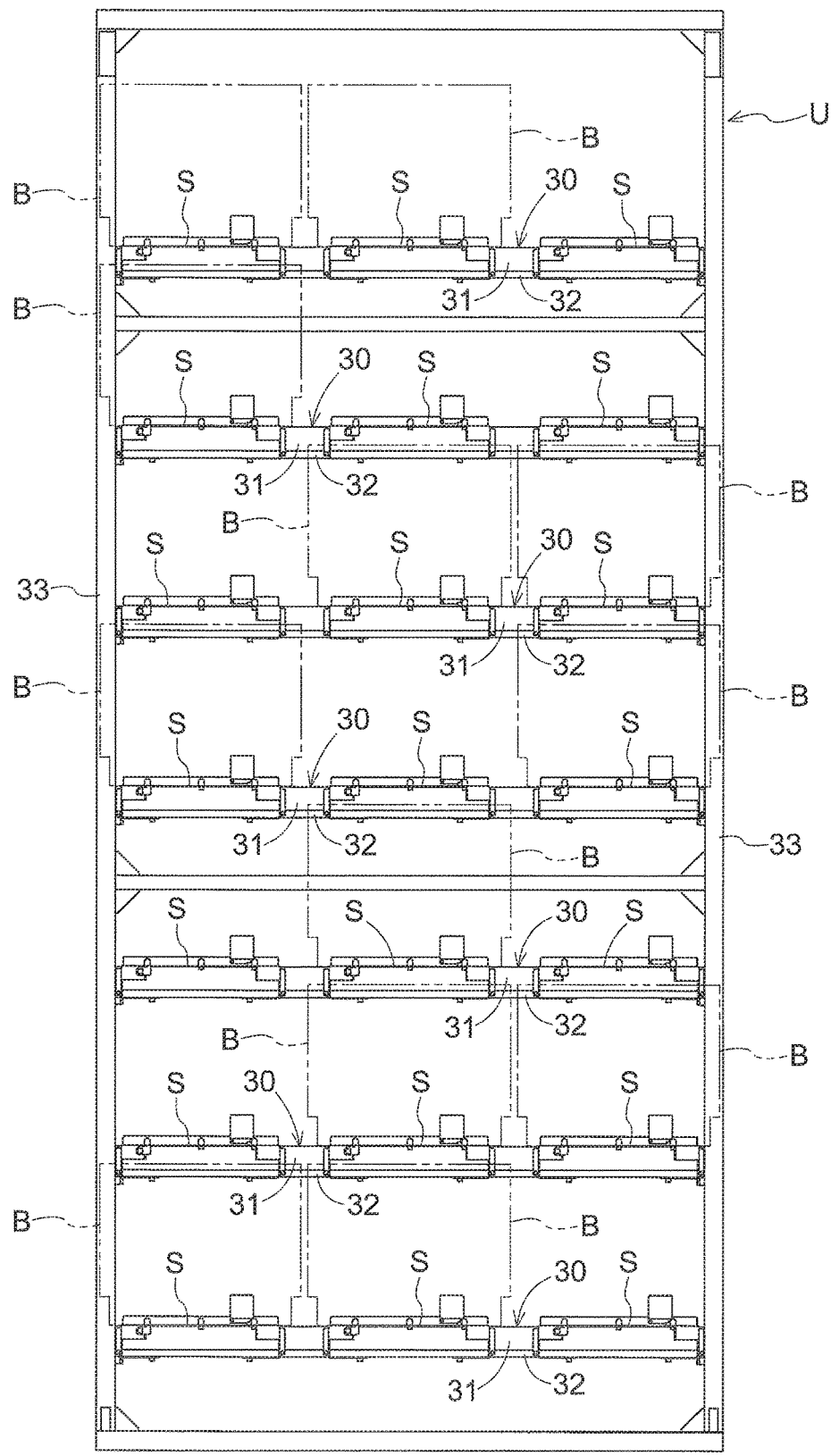
FIG. 3 is a front view of a storage rack unit.
Figure 4:
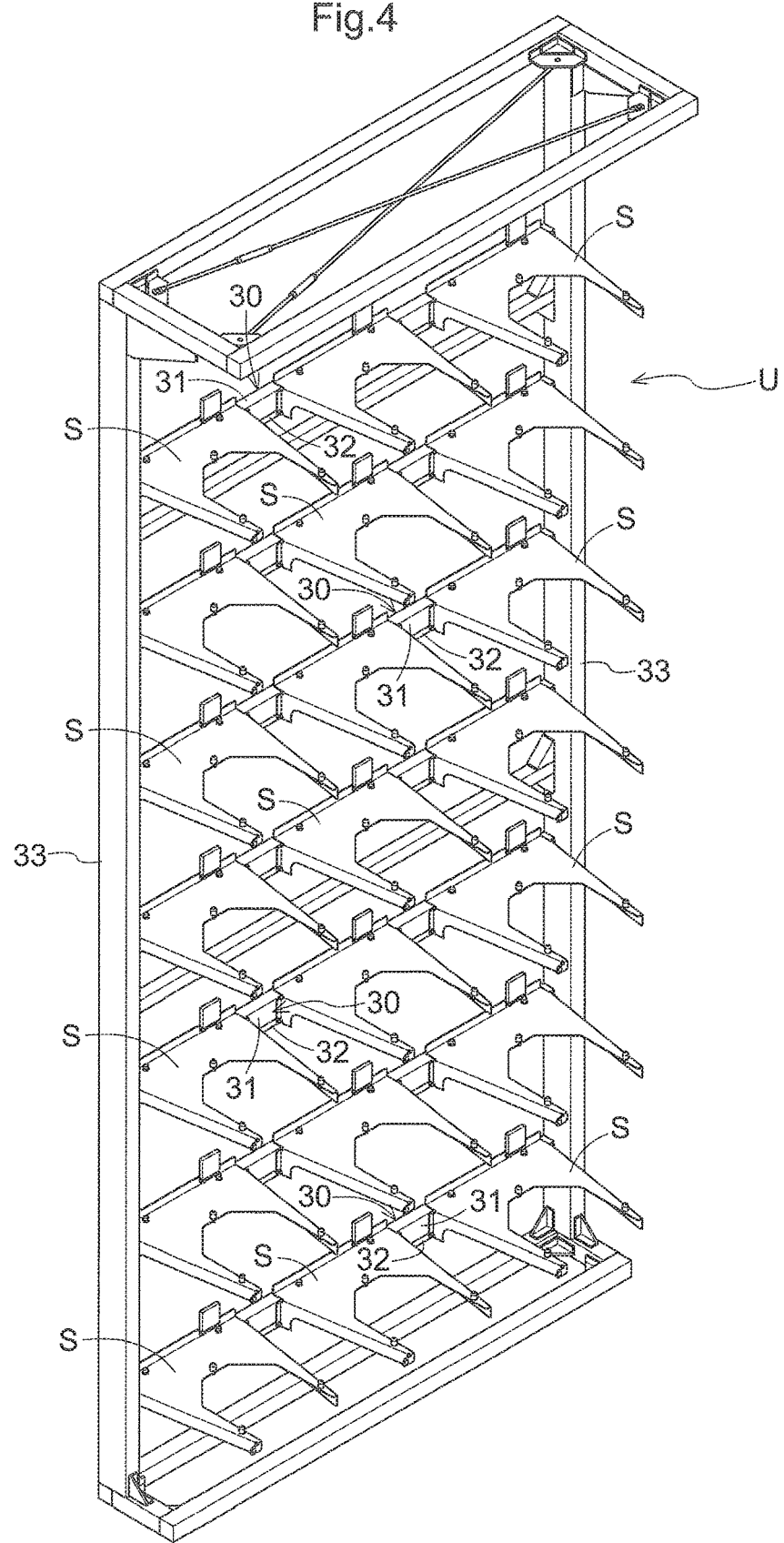
FIG. 4 is a perspective view of the storage rack unit.

As shown in FIG. 2, the stacker crane C has a travel portion 21 configured to travel on and along the travel rail R, a vertical movement guiding mast 20 arranged vertically on the travel portion 21, a vertically movable member 22 supported by the vertical movement guiding mast 20 such that the vertically movable member 22 can be moved vertically, and a projecting and retracting arm 23 which is supported by the vertically movable member 22 and which is configured to move, and project and retract, a movable support member 24 for supporting a semiconductor container B to a travel space side and to an article storing space of a storage rack unit U, along the front and back direction of the rack.

Figure 1:
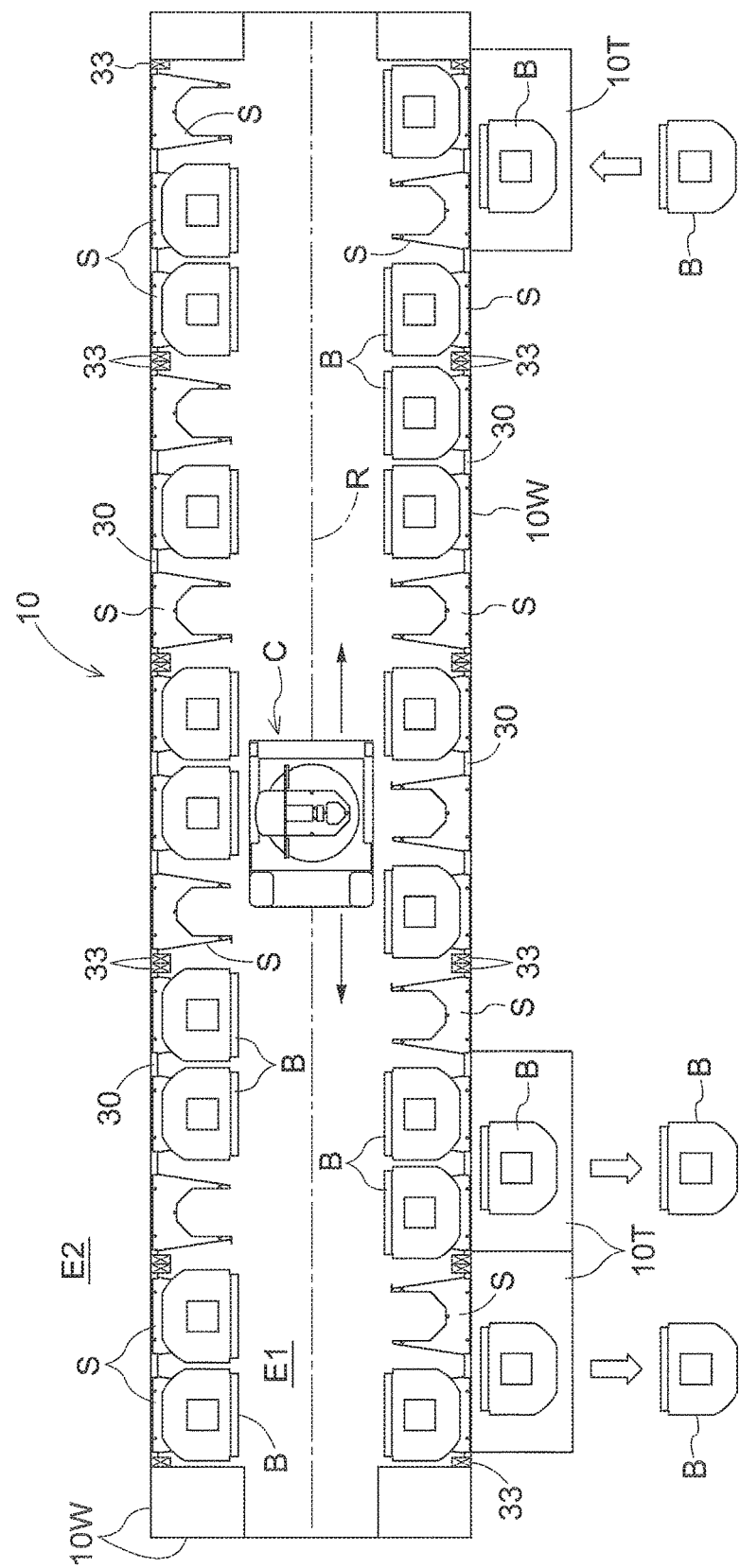
FIG. 1 is an overall plan view of a semiconductor container stocker.

As shown in FIGS. 1 and 2, the semiconductor container stocker 10 has partitioning walls 10W which surround the rack installation area in which the storage rack units U and the stacker crane C are located. The partitioning walls 10W partition or separate the rack installation area E1 from the external area E2. In addition, as shown in FIG. 2, a flow generating device D is provided at an upper end of each storage rack unit U. In addition, one or more openings are formed near a lower end portion of a partitioning wall 10W. And the gas (which may include air) in the rack installation area E1 is discharged from this opening and into a gas recovery passage provided below the floor F of the semiconductor manufacturing facility in which the semiconductor container stocker 10 is installed. Thus, the flow generating device D can generate a flow of gas downflow (downflow) that moves downward from upper positions in the rack installation area E1 and through the area in which the shelf members S arranged along the vertical direction are located.

Figure 5:
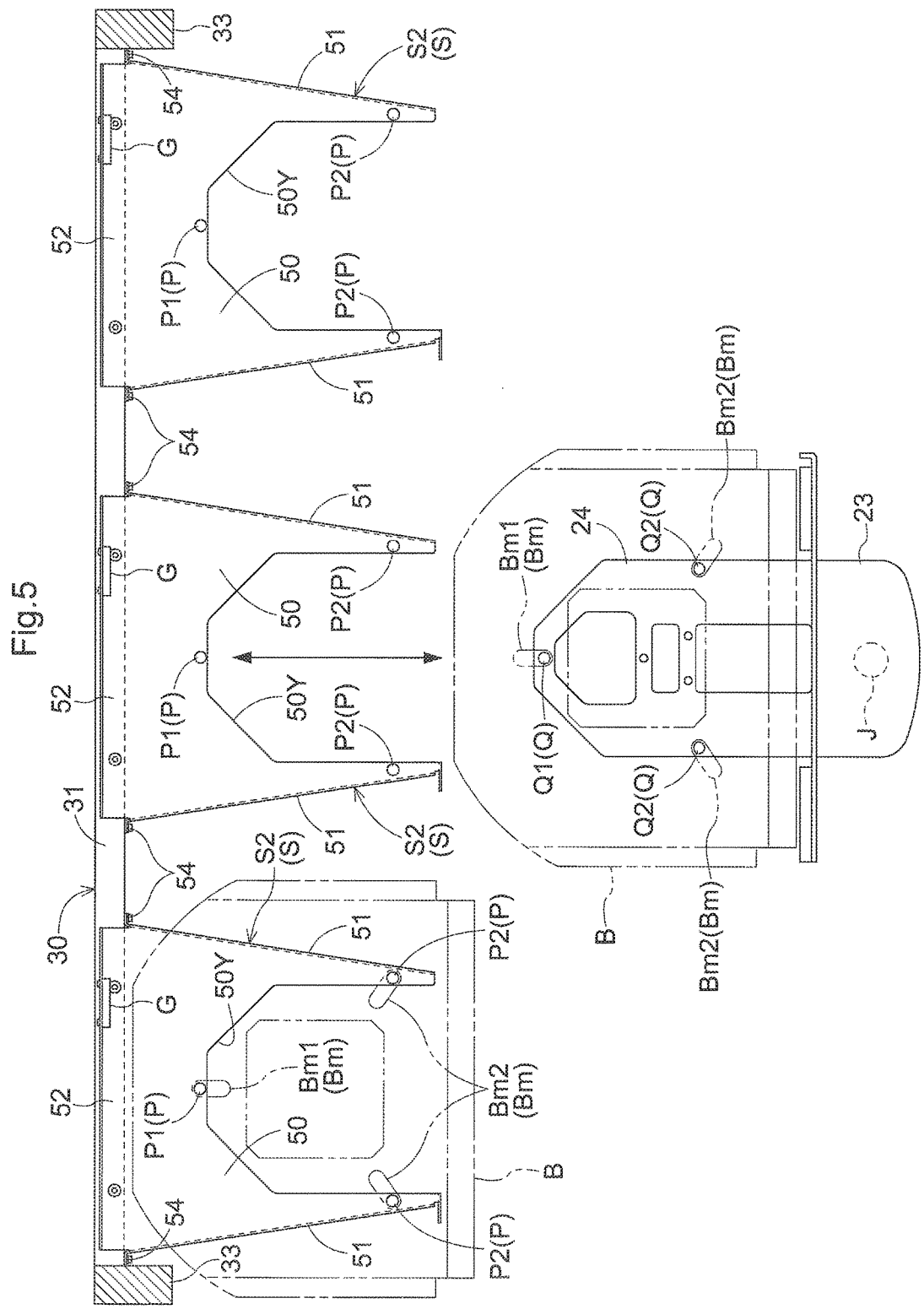
FIG. 5 is a plan view of the storage rack unit.

As shown in FIG. 5, a lid portion is provided to close an opening in the front face of each semiconductor container B. And the semiconductor container B is formed in such a shape that its width along its lateral or right and left direction is gradually narrower toward its end portion on the opposite side from the lid portion (back face) in plan view. In describing the semiconductor container B below, the lid portion side of the semiconductor container B will be referred to as the forward end portion whereas the end portion that is on the opposite side of the semiconductor container B from the lid portion will be referred to as the back end portion.

Figure 6:
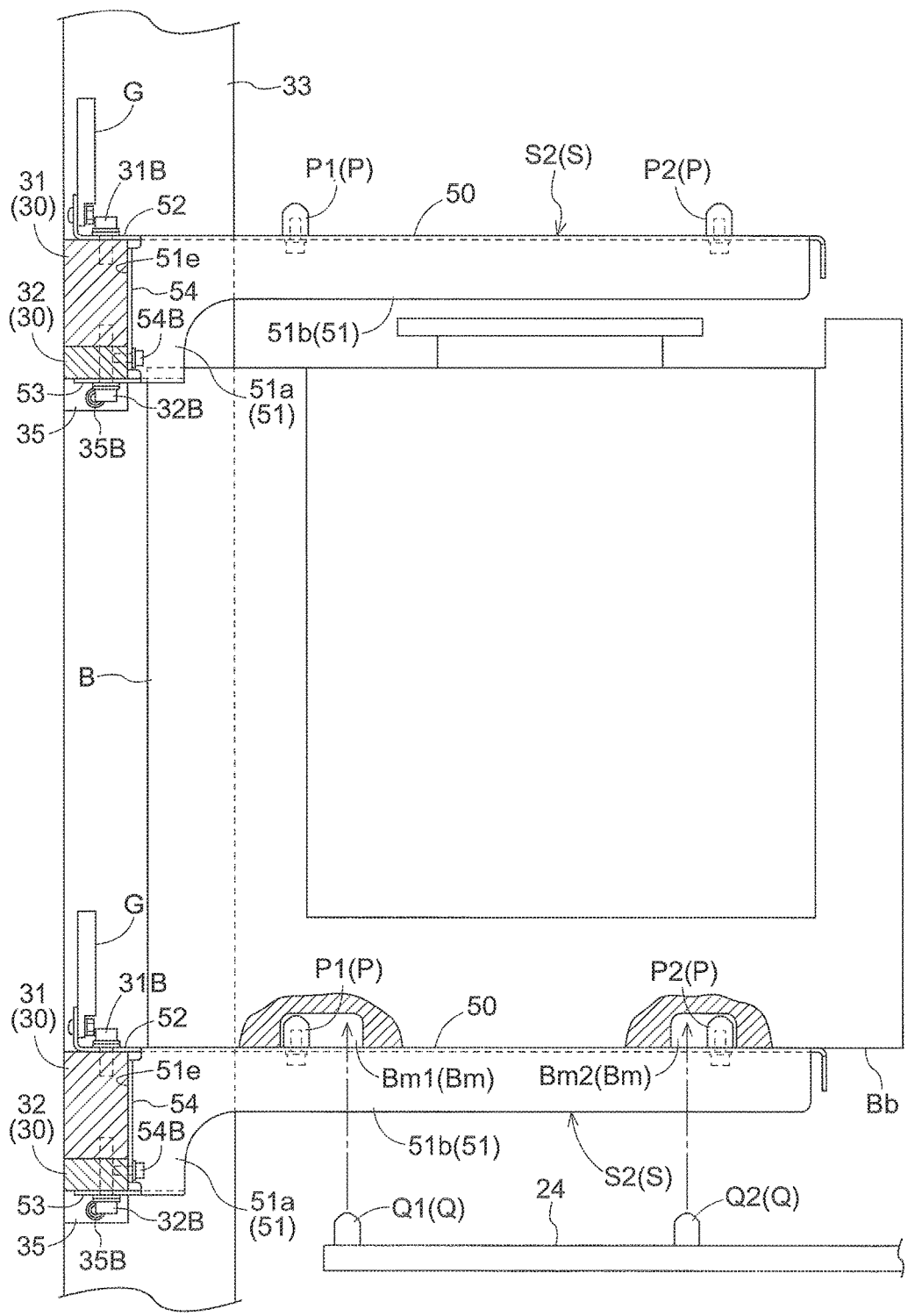
FIG. 6 is a side view showing an important portion of the storage rack unit, FIG. 7 includes a plan view and a side view of a shelf member for illustrating the positional relationship between a proximal end side portion and a distal end side portion of a support frame member.

As shown in FIGS. 5 and 6, each semiconductor container B has three positioning grooves Bm on the bottom surface Bb. Two of the three positioning grooves Bm (positioning grooves Bm2 shown in FIGS. 5 and 6) are located near or toward the forward end portion of the semiconductor container B and are spaced apart from each other along the lateral direction. One of the three positioning grooves Bm (positioning groove Bm1 shown in FIGS. 5 and 6) is located near or toward the back end portion of the semiconductor container B and is located at an intermediate position between the positioning grooves Bm2 along the lateral direction.

As shown in FIG. 5, the proximal end side portion of the movable support member 24 is supported by the projecting and retracting arm 23 through a rotatable shaft J along a vertical direction. The movable support member 24 has a support surface (in its top surface) on which a semiconductor container B is placed, and has, on the support surface, three positioning pins Q for engaging the three positioning grooves Bm provided to, or formed in, the bottom surface Bb of the semiconductor container B. Provided as the positioning pins Q are two positioning pins Q2 for engaging two respective positioning grooves Bm2, and one positioning pin Q1 for engaging one positioning groove Bm1.

The movable support member 24 is capable of transferring a semiconductor container B between the travel space through which the stacker crane C moves and any one of the storage rack units U.

As shown in FIGS. 1-4, a rack frame has a pair of columns 33 which are spaced apart from each other along the rack lateral direction and which stand upright from the lower end portion of the rack frame so that the columns 33 extend along the vertical direction, and a plurality of long laterally extending members 30 each of which is placed between the pair of columns 33 in a horizontal attitude with each of the end portions thereof fixed to the corresponding one of the pair of columns 33.

The plurality of laterally extending members 30 are located between the pair of columns 33 such that they extend along the rack lateral direction and such that they are spaced apart from one another along the vertical direction. In addition, two or three shelf members S are attached to each laterally extending member 30 such that the shelf members are arranged, and spaced apart from each other, along the rack lateral direction.

In the present embodiment, a reference surface is, or corresponds to, an imaginary surface which includes all of the plurality of laterally extending members 30 which are spaced apart from one another along the vertical direction and each of which extends along the rack lateral direction.

That is, the storage rack unit U has a rack frame which has the reference surface extending along the vertical direction, and a plurality of shelf members S each of which is attached to the rack frame and supports a semiconductor container B being stored from below. A plurality of shelf members S are arranged in a line along the vertical direction. An article storing area in which a semiconductor container B is stored is formed between any two shelf members S that are adjacent each other along the vertical direction. Each of a plurality of shelf members S is attached to the rack frame in a cantilever fashion (i.e., supported at one side) such that the shelf member projects in the projecting direction extending along a horizontal direction, from the reference surface.

Incidentally, although the outer shape of any semiconductor container B is specified by a standard, some semiconductor containers B may be heavier than others because of improvements made, for example, to increase the number of semiconductor substrates that can be held in a given volume without changing the outer shape of the containers B. In the following description, a semiconductor container B before such improvements are made will be referred to as a light-weight container whereas a semiconductor container B after such improvements are made will be referred to as a heavy-weight container. In addition, FIG. 10 shows a shelf member S in a storage rack unit U (referred to as a pre-modification unit) for light-weight containers.

The structure of a storage rack unit U for light-weight containers is described next. As shown in FIG. 10, a first laterally extending member 31 is attached to a column 33. In addition, the top surface and undersurface of the first laterally extending member 31 are formed to extend along the horizontal plane. Each shelf member S1 for a light-weight container has a support plate portion 90 which is generally plate-shaped (i.e., thin and flat) and which extends along the horizontal plane, and support frame members 91 which are located below the support plate portion 90 and at positions such that the support frame members 91 overlap with the support plate portion 90 as seen along the vertical direction to support the support plate portion 90 from below.

A cut-out portion 90Y is formed in the support plate portion 90 which provides an opening, along the vertical direction that opens in the direction (projecting direction) in which the support plate portion 90 projects. Each support frame member 91 includes an elongate member located and arranged to extend along the support plate portion 90. And a pair of support frame members 91 are provided such that one support frame member 91 is located on each side of the support plate portion 90 with respect to the cut-out portion 90Y, along the rack lateral direction (so that the cut-out portion 90Y is located between the support frame members 91 along the rack lateral direction).

Provided on the top surface of each support plate portion 90 are three positioning pins P for engaging respective three positioning grooves Bm provided to, or formed in, the bottom surface Bb of the semiconductor container B. Provided as the positioning pins P are two positioning pins P2 for engaging two respective positioning grooves Bm2, and a positioning pin P1 for engaging the positioning groove Bm1. In addition, a load presence sensor G is provided on the top surface of each support plate portion 90 for detecting whether or not any semiconductor container B is supported by the shelf member S1.

Furthermore, the shelf member S1 has an upper contact portion 92 in contact with the top surface of the first laterally extending member 31, and lower contact portions 93 in contact with the undersurface of the first laterally extending member 31. The upper contact portion 92 and the lower contact portions 93 are formed continuously from the proximal end side portion of the support frame members 91.

Female screw holes 31*hu* which the male screws 31B are in threading engagement with are formed in the top surface of the first laterally extending member 31 whereas female screw holes 31*hd* which the male screws 31B are in threading engagement with are formed in the undersurface of the first laterally extending member 31.

And through holes 92*h* whose diameter is greater than the nominal diameter of the male screws 31B are formed in the upper contact portion 92 at positions that correspond to the positions of the female screw holes 31*hu* of the first laterally extending member 31. And a through hole 93*h* whose diameter is greater than the nominal diameter of the male screws 31B is formed in each lower contact portion 93 at a position that corresponds to the position of the corresponding female screw hole 31*hd* of the first laterally extending member 31.

Furthermore, both the upper contact portion 92 and the lower contact portions 93 extend in a horizontal direction that is opposite from the projecting direction, from the proximal end portions of the support frame members 91. The upper contact portion 92 and each lower contact portion 93 are so located that they are spaced apart from each other along the vertical direction by a distance that corresponds to the vertical dimension L1 of the first laterally extending member 31.

And the top surface and undersurface of the first laterally extending member 31 are placed and held between the upper contact portion 92 and the lower contact portion 93. And male screws 31B are inserted through the through holes 92*h* of the upper contact portion 92 and are placed in threading engagement with the female screw holes 31*hu* in the top surface of the first laterally extending member 31. And male screws 31B are inserted through the through holes 93*h* of the lower contact portion 93 and are placed in threading engagement with the female screw holes 31*hd* in the undersurface of the first laterally extending member 31. This is how a shelf member S is fixed to the corresponding first laterally extending member 31.

In the present embodiment, a storage rack unit U for light-weight containers can be modified (or retrofit as the term is used below) so that it now has shelf members S2 each of which can bear the weight of a heavy-weight container, by utilizing the rack frame of a storage rack unit U for light-weight containers. This can reduce cost, compared to replacing the entire rack frame with that can support the weight of heavy-weight containers.

Figure 8:
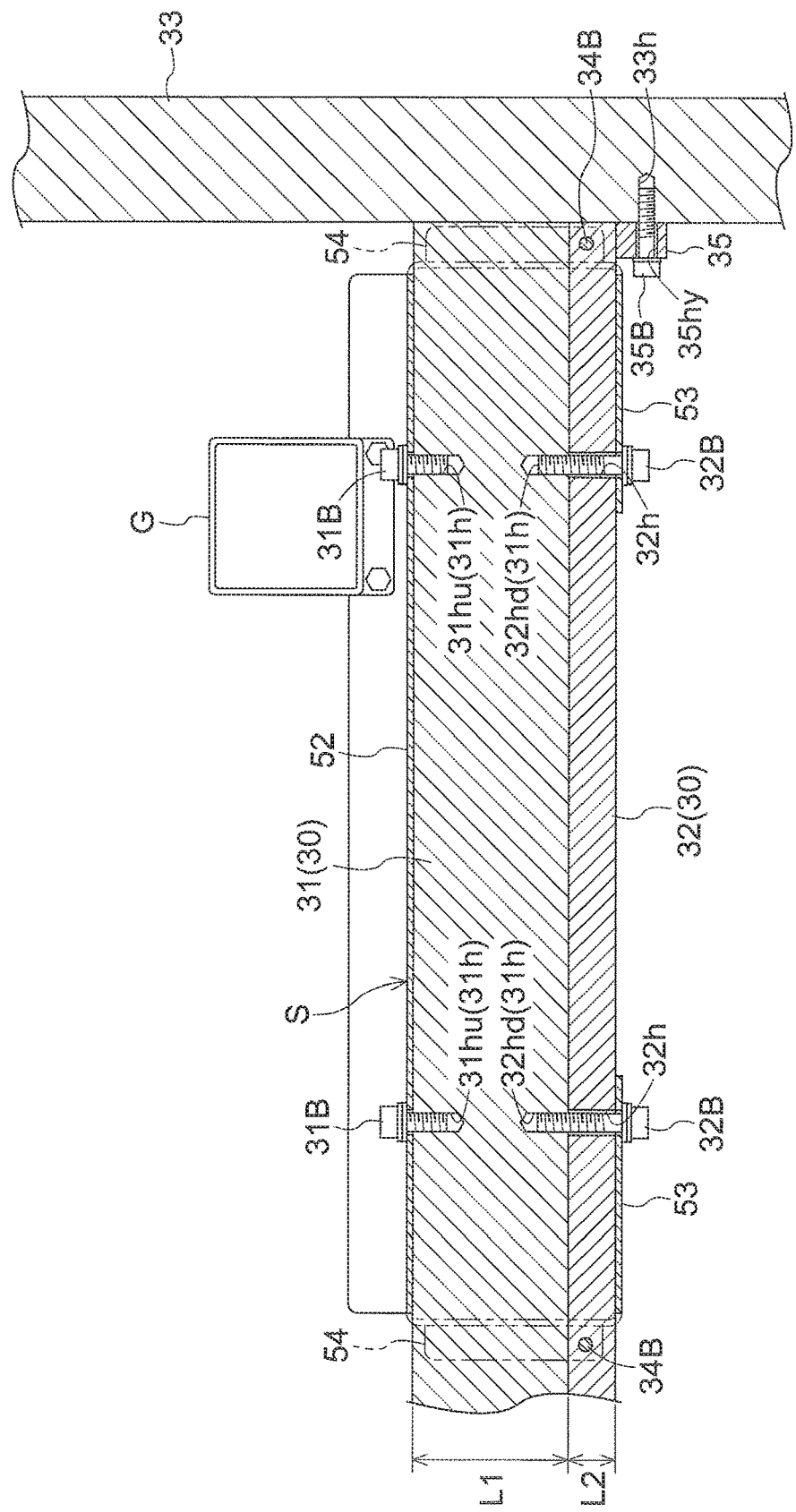
FIG. 8 is a front sectional view of a portion of the storage rack unit.
Figure 9:
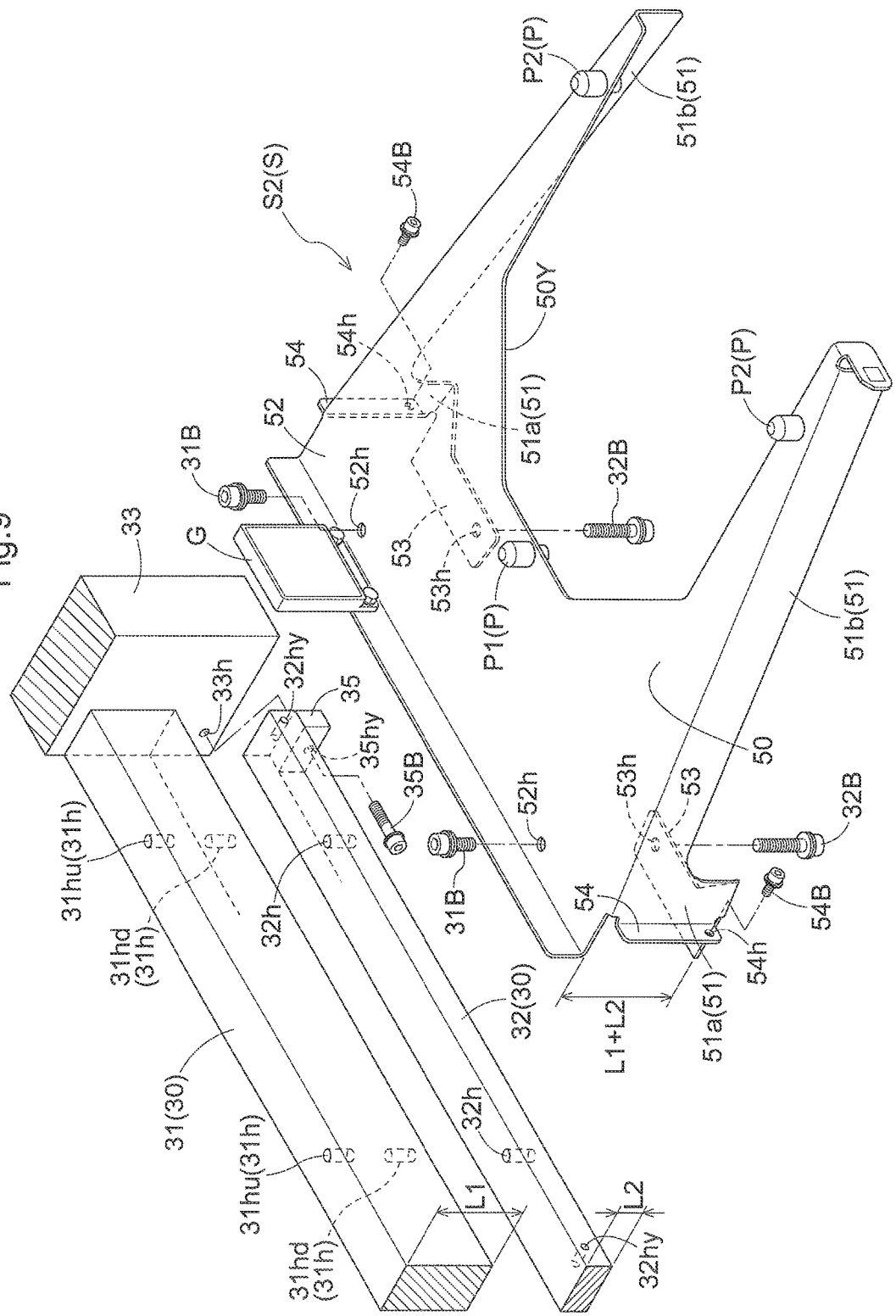
FIG. 9 is an exploded perspective view showing how a novel shelf member for a heavy-weight container is attached.

A method of retrofitting a storage rack unit U is described next. As shown in FIGS. 6, 8, and 9, each of the first laterally extending member 31 and the second laterally extending member 32 is generally formed in a rectangular shape as seen along the rack lateral direction. And the top surface and the undersurface of each of the first laterally extending member 31 and the second laterally extending member 32 extend along or parallel to the horizontal plane.

The first laterally extending member 31 is already attached to the columns 33. And a second laterally extending member 32 which has a dimension along the rack lateral direction that is approximately the same as that of the first laterally extending member 31 is placed so that it is in contact with this first laterally extending member 31 from below. Subsequently, with a support block 35 placed in contact with the second laterally extending member 32 from below, a male screw 35B is inserted into a through hole 35*hy* in the support block 35 and is made to be in threading engagement with a female screw hole 33*h* in a column 33. In this manner, the support block 35 can be fixed to the column 33 and the second laterally extending member 32 can remain located at the position below the first laterally extending member 31.

As shown in FIGS. 6, 8, and 9, female screw holes 31*hu* which the male screws 31B are in threading engagement with are formed in the top surface of the first laterally extending member 31. And female screw holes 31*hd* which the male screws 32B are in threading engagement with are formed in the undersurface of the first laterally extending member 31. And through holes 32*h* whose diameter is greater than the nominal diameter of the male screws 32B are formed in the second laterally extending member 32 at positions that correspond to the positions of the corresponding female screw holes 31*hd* of the first laterally extending member 31.

And through holes 52*h* whose diameter is greater than the nominal diameter of the male screws 31B are formed in the upper contact portion 52 at positions that correspond to the positions of the female screw holes 31*hu* of the first laterally extending member 31. And a through hole 53*h* whose diameter is greater than the nominal diameter of the male screws 32B is formed in each lower contact portion 53 at a position that corresponds to the position of the corresponding female screw hole 31*hd* of the first laterally extending member 31.

In other words, the female screw holes (31*hu*, 31*hd*) which the male screws (31B, 32B) are in threading engagement with are formed in the top surface and the undersurface of the first laterally extending member 31. And through holes 32*h* whose diameter is greater than the nominal diameter of the male screws 32B is formed in the second laterally extending member 32 at positions that correspond to the positions of the corresponding female screw holes 31*hd* of the first laterally extending member 31.

In addition, the through holes (52*h*, 53*h*) whose diameter(s) is/are greater than the nominal diameter(s) of the male screws (31B, 32B) are formed in the upper contact portion 52 and the lower contact portions 53 at positions that correspond to the positions of the respective female screw holes in the first laterally extending member 31.

Figure 7:
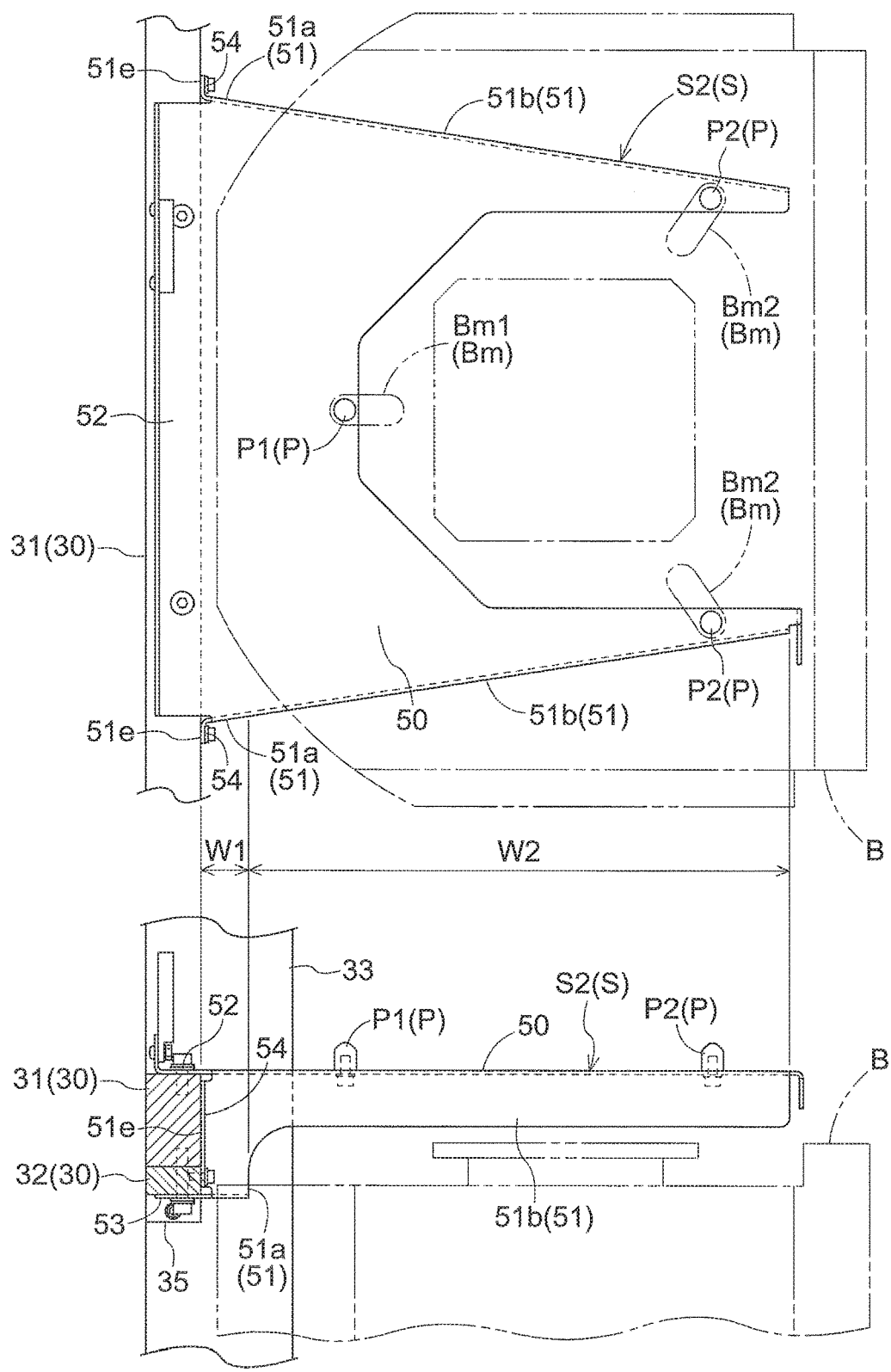

As shown in FIGS. 5-7, each shelf member S2 for a heavy-weight container has a support plate portion 50 which is generally plate-shaped (i.e. generally thin and flat) and which extends along the horizontal plane, and support frame members 51 which are located below the support plate portion 50 and at positions such that the support frame members 51 overlap with the support plate portion 50 as seen along the vertical direction to support the support plate portion 50 from below.

A cut-out portion 50Y is formed in the support plate portion 50 which provides an opening, along the vertical direction, that opens in the direction (projecting direction) in which the support plate portion 50 projects. Note that "cut-out portion 50Y . . . provides an opening, along the vertical direction" means that the cut-out portion 50Y allows an article to be moved vertically through the opening provided by the cut-out portion. Each support frame member 51 includes an elongate member located and arranged to extend along the support plate portion 50. And a pair of support frame members 51 are provided such that one support frame member 51 is located on each side of the support plate portion 50 with respect to the cut-out portion 50Y, along the rack lateral direction (so that the cut-out portion 50Y is located between the support frame members 51 along the rack lateral direction).

Provided on the top surface of each support plate portion 50 are three positioning pins P for engaging respective three positioning grooves Bm provided to, or formed in, the bottom surface Bb of the semiconductor container B. Provided as the positioning pins P are two positioning pins P2 for engaging two respective positioning grooves Bm2, and a positioning pin P1 for engaging the positioning groove Bm1.

As shown in FIGS. 5-7, each member of the pair of the support frame members 51 has a proximal end side portion 51a (the portion that is in the area W1 in FIG. 7) which includes a proximal end portion in contact with the reference surface, and a distal end side portion 51b (portion in the area W2 in FIG. 7) which is the portion on the projecting direction side with respect to the proximal end side portion 51a. As shown in FIG. 7, each proximal end side portion 51a has a portion that overlaps with an article storing area formed under the support plate portion 50, as seen along the rack lateral direction.

In addition, as shown in FIGS. 6 and 7, each distal end side portion 51b is located above the article storing area formed below the support plate portion 50 that includes the distal end side portion 51b as seen along the rack lateral direction. As shown in FIGS. 5 and 7, the pair of support frame members 51 are arranged to extend at angles with respect to the projecting direction and in such directions that the distance of separation between the support frame members 51 of the pair along the rack lateral direction is gradually smaller toward the distal ends in the projecting direction, such that both of the proximal end side portions 51a of the pair are located outside the article storing area along the rack lateral direction as seen along the vertical direction and such that each of the distal end side portions 51b of the pair has a portion that overlaps with the article storing area as seen along the vertical direction.

In addition, as shown in FIG. 9, each side edge of the support plate portion 50 along the rack lateral direction has a linear portion. Each of the support frame members 51 of the pair has a portion that is generally plate-shaped (generally thin and flat) and that is bent downward from the linear portion of the corresponding one of the pair of side edges.

As shown in FIGS. 5-9, each shelf member S2 has an upper contact portion 52 in contact with the top surface of a laterally extending member 30, and lower contact portions 53 in contact with the undersurface of the laterally extending member 30.

As shown in FIGS. 6 and 7, the upper contact portion 52 and the lower contact portions 53 are formed continuously from the proximal end side portions 51a of the support frame members 51. Both the upper contact portion 52 and the lower contact portions 53 extend in a horizontal direction that is opposite from the projecting direction, from the proximal end portions 51e of the support frame members 51. As shown in FIG. 8, the upper contact portion 52 and each lower contact portion 53 are so located that they are spaced apart from each other along the vertical direction by a distance that corresponds to the sum of the vertical dimension L1 of the first laterally extending member 31 and the vertical dimension L2 of the second laterally extending member 32.

In addition, each proximal end portion 51e is a surface that faces toward a direction that is opposite from the projecting direction. A front face contact portion 54 is formed in a surface that faces toward the projecting direction (which surface will be referred to, hereinafter, as the front face) with respect to the corresponding proximal end portion 51e. The proximal end portion 51e and the front face contact portion 54 are surfaces that are formed on the same plate-shaped portion and that faces in mutually opposite directions. As shown in FIG. 9, a through hole 54h whose diameter is greater than the nominal diameter of the male screws 54B is formed in each front face contact portion 54. Female screw holes 32hy which the male screws 54B are in threading engagement with are formed in the front face of the second laterally extending member 32. And the proximal end portions 51e and the front faces of the first laterally extending member 31 and the second laterally extending member 32 can be fixed to each other with the proximal end portions 51e and the front faces of the first laterally extending member 31 and the second laterally extending member 32 in contact with each other, by inserting the male screws 54B into respective large through holes 54h and placing them in threading engagement with the female screw holes 32hy.

With the arrangement described above, the first laterally extending member 31 concerned and the second laterally extending member 32 are placed and held between the upper contact portion 52 and the lower contact portion 53, with the second laterally extending member 32 in contact with the first laterally extending member 31 from below. And male screws 31B are inserted through the through holes 52h of the upper contact portion 52 and are placed in threading engagement with the screw holes 31hu in the upper end of the first laterally extending member 31. And the male screw 32B are inserted through the through holes 53h of the lower contact portions 53 and through the through holes 32h of the second laterally extending member 32, and are placed in threading engagement with the female screw holes 31hd in the lower end of the first laterally extending member 31. This joins the first laterally extending member 31 and the second laterally extending member 32 to each other. In other words, the first laterally extending member 31 and the second laterally extending member 32 are joined to each other or together by the upper contact portion 52 and the lower contact portions 53.

In the present embodiment, each laterally extending member 30 consists of a first laterally extending member 31 and a second laterally extending member 32. In other words, each of a plurality of laterally extending members 30 includes a first laterally extending member 31 whose each end portion along the rack lateral direction is fixed to the corresponding one of the columns 33 and a second laterally extending member 32 in contact with the first laterally extending member 31 from below.

This method allows a rack frame to be modified so that shelf members S2 for heavy-weight containers can be mounted to the rack frame by utilizing the first laterally extending members 31 already fixed to the columns 33, and thus can reduce cost, compared to replacing the entire rack frame with that can support the weight of heavy-weight containers. And, in addition, the structure can be simplified as a result of the fact that each upper contact portion 52 and the corresponding lower contact portion 53 for attaching a shelf member S2 to a rack frame also have the function to join the first laterally extending member 31 and the second laterally extending member 32 to each other.

Alternative Embodiments (1) In the embodiment described above, an arrangement is described in which the support frame members are portions that are generally plate-shaped and that are bent downward from the linear portions in the side edges on both sides along the rack lateral direction. However, the plate-shape portions may be formed separately from the support plate portion 50, and the plate-shape portions and the side edges on both sides of the support plate portion 50 along the rack lateral direction may be connected together by, for example, welding. In addition, each support frame member may be a solid or hollow member that is generally formed in a rod-shape instead of a member that is generally plate-shaped. The structure and manufacturing method of the support members may be freely selected as long as each pair of support frame members are arranged to extend at angles with respect to the projecting direction and in such directions that the distance of separation between the support frame members of the pair along the rack lateral direction is gradually smaller toward the distal ends in the projecting direction, such that both of the proximal end side portions of the pair are located outside the article storing area along the rack lateral direction as seen along the vertical direction and such that each of the distal end side portions of the pair has a portion that overlaps with the article storing area as seen along the vertical direction.

(2) In the embodiment described above, an example is described in which each rack frame has a pair of columns 33, and a plurality of long laterally extending members 30 each of which connects the pair of columns 33 with each of the end portions thereof fixed to the corresponding one of the pair of columns 33. However, the rack frame does not need to have such a structure. For example, each rack frame may have a single column, and laterally extending members 30 that extend from the column.

(3) In the embodiment described above, an example is described in which each of the first laterally extending member 31 and the second laterally extending member 32 is generally formed in a rectangular shape as seen along the rack lateral direction. The shape of the first laterally extending members 31 and the second laterally extending members 32 as seen along the rack lateral direction is not limited to a generally rectangular shape. For example, the first laterally extending member 31 may be generally formed to have a shape of a semicircle that projects upward as seen along the rack lateral direction whereas the second laterally extending member 32 may be generally formed to have a shape of a semicircle that projects downward as seen along the rack lateral direction so that the shape of the first and second extending members 31, 32 when joined together vertically would generally have a shape of a circle as seen along the rack lateral direction. In this case, the upper contact portion may be configured to contact at least the top surface of the first laterally extending member 31 and the lower contact portion may be configured to contact at least the undersurface of the second laterally extending member 32. Alternatively, the shape of the first and second extending members 31, 32 when joined together vertically may generally have an elliptical shape or an irregular cross-sectional shape other than the rectangular shape as seen along the rack lateral direction.

(4) In the embodiment described above, an example is described in which the top surface of the first laterally extending member 31 and the undersurface of the second laterally extending member 32 are formed to extend along the horizontal plane and in which both the upper contact portion 52 and the lower contact portions 53 extend in a horizontal direction that is opposite from the projecting direction, from the proximal end portions of the support frame members 51. However, the present invention is not limited to such arrangement. For example, the top surface of the first laterally extending member 31 may be formed as a sloped surface that is tilted downward toward its end portion in the projecting direction. The undersurface of the second laterally extending member 32 may be formed as a sloped surface which is tilted upwardly toward its end portion in the projecting direction. And the upper contact portion 52 may be formed to extend at an angle along the top surface of the first laterally extending member 31 and the lower contact portion 53 may be formed to extend at an angle along the undersurface of the second laterally extending member 32.

(5) In the embodiment described above, an example is described in which the second laterally extending member 32 is configured to be in contact with the first laterally extending member 31 from below. However, the second laterally extending member 32 may be configured to be in contact with the first laterally extending member 31 from above. In this case, the through holes 32h in the second laterally extending member 32 would be formed at positions that correspond to the female screw holes 31hu in the top surface of the first laterally extending member 31.

(6) In the embodiment described above, an example is described in which semiconductor containers B are the objects being stored. However, the present invention is not limited to such arrangement. For example, articles other than the semiconductor containers B, such as food, may be the objects being stored. In this case arrangements may be made such that, for example, gas for freezing food items, or gas for cold storage, etc., used for the purposes of preserving food may be caused to flow downward from heights above the area where the shelf members S in the rack installation area.

(7) In the embodiment described above, an example is described in which each storage rack unit U has two or the three shelf members S arranged in a row along the rack lateral direction. However, a storage rack unit U may have four or more shelf members S arranged in a row along the rack lateral direction. Alternatively, a storage rack unit U may have only one shelf member.

(8) In the embodiment described above, an example is described in which the storage rack units U are so located and arranged that the reference surfaces of the plurality of storage rack units U are all in a same plane. However, the present invention is not limited to such arrangement. For example, a plurality of storage rack units U may be located such that their positions along the projecting direction are displaced from one another. In addition, a transfer device which can be moved along the vertical direction and which can be rotated about a vertical axis may be provided. And a plurality of storage rack units U may be located and arranged in an arc or circular pattern so as to surround the transport device as seen along the vertical direction.

Summary of Embodiments Described above

A brief summary of the article storage rack described above is provided next.

The article storage rack comprises: a rack frame having a reference surface which extends along a vertical direction; a plurality of shelf members each of which is attached to the rack frame and is configured to support an article being stored from below; wherein the plurality of shelf members are arranged in a line along the vertical direction, wherein an article storing area in which an article is stored is formed between any two shelf members of the plurality of shelf members that are adjacent each other along the vertical direction, wherein each shelf member of the plurality of shelf members is attached to the rack frame in a cantilever fashion such that each shelf member projects from the reference surface in a projecting direction along a horizontal direction, wherein each of the plurality of shelf members has a support plate portion which is generally plate-shaped and which extends along a horizontal plane, and support frame members which are located below the support plate portion and at positions such that the support frame members overlap with the support plate portion as seen along the vertical direction to support the support plate portion from below, wherein the support plate portion is formed in a shape that tapers toward a distal end portion thereof such that a width of the support plate portion, along a rack lateral direction which is parallel to the horizontal plane and is perpendicular to the projecting direction, is narrower toward the distal end portion, wherein a cut-out portion is formed in the support plate portion, the cut-out portion providing an opening, along the vertical direction, that opens in the projecting direction, wherein each of the support frame members includes an elongate member located and arranged to extend along the support plate portion, wherein a pair of support frame members are provided to each of the plurality of shelf members such that one support frame member is located on each side of the support plate portion with respect to the cut-out portion, along the rack lateral direction, wherein each support frame member in the pair of the support frame members has a proximal end side portion which includes a proximal end portion in contact with the reference surface, and a distal end side portion which is a portion located on the projecting direction side with respect to the proximal end side portion, wherein the proximal end side portion has a portion that overlaps with an article storing area formed under a corresponding support plate portion supported by the support frame member that includes the proximal end side portion, as seen along the rack lateral direction, wherein the distal end side portion is located above the article storing area formed under the corresponding support plate portion supported by the support frame member that includes the proximal end side portion, as seen along the rack lateral direction, and wherein the support frame members in the pair of support frame members are arranged to extend at angles with respect to the projecting direction and in such directions that a distance of separation between the support frame members in the pair along the rack lateral direction is gradually smaller toward distal ends of the support frame members in the projecting direction, such that both of proximal end side portions of the pair of support frame members are located outside the article storing area along the rack lateral direction as seen along the vertical direction and such that each of distal end side portions of the pair of the support frame members has a portion that overlaps with the article storing area as seen along the vertical direction.

That is, because the support plate portion is formed in a shape that tapers toward a distal end portion thereof such that a width of the support plate portion is narrower toward the distal end portion, a space (referred to as the "space outside the shelf member") through which a downflow of gas can move can be formed outward of both side edges (with respect to the rack lateral direction) of the support plate portion. Here, since the support frame members are located at positions at which their proximal end portions overlap with the support plate portion as seen along the vertical direction, with the support frame members in contact with the reference surface of the rack frame, the proximal end side portions of the support frame members can be located close to each other along the rack lateral direction. And the support frame members project in the projecting direction with the support frame members in contact with the reference surface of the rack frame. And the support frame members are arranged to extend at angles with respect to the projecting direction and in such directions that the distance of separation between the support frame members in the pair along the rack lateral direction is gradually smaller toward distal ends of the support frame members in the projecting direction. Thus, the width of the support plate portion can be made small over its entire length along the projecting direction, and the space outside the shelf member can be formed over the entire length along the projecting direction. This arrangement makes it easier to form a downflow outward of both side edges (with respect to the rack lateral direction) of the support plate portion.

Further, since the distal end side portions of the pair of the support frame members are both located such that they overlap with the article storing area as seen along the vertical direction, the load or weight of the article supported by the support plate portion can be properly supported from below the article by the support frame members.

Thus, with the arrangement described above, an article storage rack is provided in which it is easy to form a downflow around articles being stored and which has shelf members each of which can properly support the weight of an article.

Here, each side edge of the support plate portion along the rack lateral direction preferably has a linear portion, and wherein each of the support frame members in the pair preferably has a portion that is generally plate-shaped and that is bent downward from the linear portion of a corresponding side edge.

Thus, each of the support frame members in the pair can be formed by a simple method involving bending it downward from the linear portion of a corresponding side edge.

In addition, the rack frame preferably has a pair of columns, and a plurality of laterally extending members each of which has an elongate shape, wherein the plurality of laterally extending members are preferably located between the pair of columns such that each of the plurality of laterally extending members extends along the rack lateral direction and such that the plurality of laterally extending members are spaced apart from one another along the vertical direction, wherein each of the plurality of shelf members preferably has an upper contact portion in contact with a top surface of a corresponding one of the plurality of laterally extending members, and a lower contact portion in contact with an undersurface of the corresponding one of the plurality of laterally extending members, wherein each of the plurality of laterally extending members preferably includes a first laterally extending member whose each end portion along the rack lateral direction is fixed to a corresponding one of the pair of columns and a second laterally extending member in contact with the first laterally extending member either from above or from below.

Thus, the laterally extending member can be reinforced by having the second laterally extending member in contact with the first laterally extending member (fixed to a pair of columns) either from above or from below.

Therefore, when there is an existing article storage rack comprising the rack frame having the first laterally extending members and shelf members attached to the rack frame, the article storage rack can be converted into one that can store articles with larger weight by adding the second laterally extending member to the rack frame in the article storage rack and by attaching shelf members for the reinforced laterally extending members each of which consists of a first laterally extending member and a second laterally extending member.

Thus, even when a need arises to store heavier articles as articles to be stored, the existing article storage rack can be utilized, making it possible to reduce cost for the components.

In addition, the upper contact portion and the lower contact portion are preferably formed continuously from the proximal end side portion of a corresponding support frame member, wherein the first laterally extending member and the second laterally extending member are preferably joined together by the upper contact portion and the lower contact portion.

That is, when a laterally extending member is formed by the first laterally extending member and the second laterally extending member, it is necessary to join the first laterally extending member and the second laterally extending member to each other. In the arrangement described above, the first laterally extending member and the second laterally extending member are placed and held between, and joined to each other by the upper contact portion and the lower contact portion that are formed continuously from the proximal end side portion of the corresponding support frame member; thus, the same members can be used as both a shelf member and members for joining together the first laterally extending member and the second laterally extending member. Thus, the number of components that make up the article storage rack can be reduced compared to an arrangement in which separate members for joining together the first laterally extending member and the second laterally extending member are provided (for example, nuts and bolts that extend through the first laterally extending member and the second laterally extending member along the vertical direction, or belt-shaped members etc. for fastening together the first laterally extending member and the second laterally extending member).

In addition, a female screw hole configured to be in threading engagement with a male screw is preferably formed in each of a top surface and an undersurface of the first laterally extending member, wherein a through hole whose diameter is greater than a nominal diameter of the male screw is preferably formed in the second laterally extending member at a position that corresponds to the female screw hole in the first laterally extending member, and wherein a through hole whose diameter is greater than a nominal diameter of the male screw is preferably formed in each of the upper contact portion and the lower contact portion at a position that corresponds to the female screw hole in the first laterally extending member.

That is, in an existing article storage rack having shelf members for articles with small weight, a female screw hole configured to be in threading engagement with a male screw is formed in each of a top surface and an undersurface of the first laterally extending member; thus, a new shelf member for an article with large weight can be attached by inserting a male screw into the through hole formed in the second laterally extending member at a position that corresponds to the female screw hole in the first laterally extending member.

Thus, when a laterally extending member is formed with a first laterally extending member and a second laterally extending member, the female screw hole in the first laterally extending member can be utilized, thus rendering unnecessary, or reduce the amount of, the time and effort of modifying the rack frame of the existing article storage rack when reinforcing the rack frame with second laterally extending members and attaching new shelf members.

In addition, each of the first laterally extending member and the second laterally extending member is preferably generally formed in a rectangular shape as seen along the rack lateral direction, and a top surface and an undersurface of each of the first laterally extending member and the second laterally extending member extend parallel to the horizontal plane, wherein both the upper contact portion and the lower contact portion preferably extend in a horizontal direction that is opposite from the projecting direction, from the proximal end portion of the corresponding support frame member, and wherein the upper contact portion and the lower contact portions are preferably spaced apart from each other along the vertical direction by a distance that corresponds to a sum of a vertical dimension of the first laterally extending member and a vertical dimension of the second laterally extending member.

Since both the upper contact portion and the lower contact portion extend in a horizontal direction that is opposite from the projecting direction, from the proximal end portion of the corresponding support frame member, and are spaced apart from each other along the vertical direction by a distance that corresponds to a sum of a vertical dimension of the first laterally extending member and a vertical dimension of the second laterally extending member, the first laterally extending member and second laterally extending member which are joined together along the vertical direction can be held between the upper contact portion and the lower contact portion to properly fix them.

An article storage facility that includes the article storage rack, preferably comprises: partitioning walls arranged to surround a rack installation area in which the article storage rack is installed to partition the rack installation area from an area outside thereof; and a flow generating device configured to create a downward flow of gas from an elevated position in an area in which the plurality of shelf members arranged in a line along the vertical direction exist in the rack installation area.

Thus, a downward flow of gas from an elevated position in an area in which the plurality of shelf members arranged in a line along the vertical direction exist in the rack installation area can be generated or created.

In such arrangement, a space through which a downflow of gas can move is formed outward of both side edges (with respect to the rack lateral direction) of the support plate portion is also formed. Thus, a downflow of gas can be formed properly in such article storage facility.

What is claimed is:

1. An article storage rack comprising:
   a rack frame having a reference surface which extends along a vertical direction; and
   a plurality of shelf members each of which is attached to the rack frame and is configured to support an article being stored from below;
   wherein the plurality of shelf members are arranged in a line along the vertical direction, wherein an article storing area in which an article is stored is formed between any two shelf members of the plurality of shelf members that are adjacent each other along the vertical direction, wherein each shelf member of the plurality of shelf members is attached to the rack frame in a cantilever fashion such that each shelf member projects from the reference surface in a projecting direction along a horizontal direction,
   wherein each of the plurality of shelf members has a support plate portion which is generally plate-shaped and which extends along a horizontal plane, and support frame members which are located below the support plate portion and at positions such that the support frame members overlap with the support plate portion as seen along the vertical direction to support the support plate portion from below,
   wherein the support plate portion is formed in a shape that tapers toward a distal end portion thereof such that a width of the support plate portion, along a rack lateral direction which is parallel to the horizontal plane and is perpendicular to the projecting direction, is narrower toward the distal end portion,
   wherein a cut-out portion is formed in the support plate portion, the cut-out portion providing an opening, along the vertical direction, that opens in the projecting direction,
   wherein each of the support frame members includes an elongate member located and arranged to extend along the support plate portion, wherein a pair of support frame members are provided to each of the plurality of shelf members such that one support frame member is located on each side of the support plate portion with respect to the cut-out portion, along the rack lateral direction,
   wherein each support frame member in the pair of the support frame members has a proximal end side portion which includes a proximal end portion in contact with the reference surface, and a distal end side portion which is a portion located on the projecting direction side with respect to the proximal end side portion,
   wherein the proximal end side portion has a portion that overlaps with an article storing area formed under a corresponding support plate portion supported by the support frame member that includes the proximal end side portion, as seen along the rack lateral direction,
   wherein the distal end side portion is located above the article storing area formed under the corresponding support plate portion supported by the support frame member that includes the proximal end side portion, as seen along the rack lateral direction, and
   wherein the support frame members in the pair of support frame members are arranged to extend at angles with respect to the projecting direction and in such directions that a distance of separation between the support frame members in the pair along the rack lateral direction is gradually smaller toward distal ends of the support frame members in the projecting direction, such that both of proximal end side portions of the pair of support frame members are located outside the article storing area along the rack lateral direction as seen along the vertical direction and such that each of distal end side portions of the pair of the support frame members has a portion that overlaps with the article storing area as seen along the vertical direction.

2. The article storage rack as defined in claim 1, wherein each side edge of the support plate portion along the rack lateral direction has a linear portion, and
   wherein each of the support frame members in the pair has a portion that is generally plate-shaped and that is bent downward from the linear portion of a corresponding side edge.

3. The article storage rack as defined in claim 1, wherein the rack frame has a pair of columns, and a plurality of laterally extending members each of which has an elongate shape,
   wherein the plurality of laterally extending members are located between the pair of columns such that each of the plurality of laterally extending members extends along the rack lateral direction and such that the plurality of laterally extending members are spaced apart from one another along the vertical direction,
   wherein each of the plurality of shelf members has an upper contact portion in contact with a top surface of a corresponding one of the plurality of laterally extending members, and a lower contact portion in contact with an undersurface of the corresponding one of the plurality of laterally extending members, and
   wherein each of the plurality of laterally extending members includes a first laterally extending member whose each end portion along the rack lateral direction is fixed to a corresponding one of the pair of columns and a second laterally extending member in contact with the first laterally extending member either from above or from below.

4. The article storage rack as defined in claim 3, wherein the upper contact portion and the lower contact portion are formed continuously from the proximal end side portion of a corresponding support frame member, and
   wherein the first laterally extending member and the second laterally extending member are joined together by the upper contact portion and the lower contact portion.

5. The article storage rack as defined in claim 4, wherein a female screw hole configured to be in threading engagement with a male screw is formed in each of a top surface and an undersurface of the first laterally extending member,
   wherein a through hole whose diameter is greater than a nominal diameter of the male screw is formed in the second laterally extending member at a position that corresponds to the female screw hole in the first laterally extending member, and wherein a through hole whose diameter is greater than a nominal diameter of the male screw is formed in each of the upper contact portion and the lower contact portion at a position that corresponds to the female screw hole in the first laterally extending member.

6. The article storage rack as defined in claim 4, wherein each of the first laterally extending member and the second laterally extending member is generally formed in a rectangular shape as seen along the rack lateral direction, and a top surface and an undersurface of each of the first laterally extending member and the second laterally extending member extend parallel to the horizontal plane, wherein both the upper contact portion and the lower contact portion extend in a horizontal direction that is opposite from the projecting direction, from the proximal end portion of the corresponding support frame member, and wherein the upper contact portion and the lower contact portion are spaced apart from each other along the vertical direction by a distance that corresponds to a sum of a vertical dimension of the first laterally extending member and a vertical dimension of the second laterally extending member.

7. An article storage facility comprising:

the article storage rack as defined in claim 1;

partitioning walls arranged to surround a rack installation area in which the article storage rack is installed to partition the rack installation area from an area outside thereof; and a flow generating device configured to create a downward flow of gas from an elevated position in an area in which the plurality of shelf members arranged in a line along the vertical direction exist in the rack installation area.

* * * * *